Jan. 12, 1971 E. D. KOZELNICKY 3,553,824

PROCESS FOR ELIMINATING ICICLE-LIKE FORMATIONS ON SOLDERED CIRCUIT SUBSTRATES

Filed May 9, 1968 2 Sheets-Sheet 1

INVENTOR.
EDWARD D. KOZELNICKY

BY J. J. Landis

ATTORNEY

United States Patent Office 3,553,824
Patented Jan. 12, 1971

3,553,824

PROCESS FOR ELIMINATING ICICLE-LIKE FORMATIONS ON SOLDERED CIRCUIT SUBSTRATES

Edward D. Kozelnicky, Center Valley, Pa., assignor to Western Electric Company, Incorporated, New York, N.Y., a corporation of New York Filed May 9, 1968, Ser. No. 727,866
Int. Cl. B23k *31/02*
U.S. Cl. 29—487 5 Claims

ABSTRACT OF THE DISCLOSURE

The icicle-like formations of solder which are produced in conventional soldering processes, when a circuit carried on a substrate is subjected to an underlying solder bath, are substantially reduced in size by inverting the circuit to an upwardly facing orientation, coating it with a flux (either before or after the inversion) and subjecting the fluxed soldered surface to an infra-red or other radiant heat sorce radiating sufficient heat to melt the icicles.

BACKGROUND OF THE INVENTION

This invention relates generally to the soldering of circuits carried upon substrates, and in particular to the process for minimizing icicle-like formations which conventionally occur.

Circuits carried upon substrates (hereinafter generically designated "circuit substrates") take many forms. They include printed circuit boards, thin films and thick films deposited on glass and ceramic substrates.

Once the circuit substrate has been formed it is often necessary to connect conductive leads to the circuit to permit its utilization. In the case of printed circuit boards components must be coupled to the circuit through the substrate. In either case the leads are generally affixed to the circuit by passing the substrate, with the circuit side down, over a solder bath so that the conductive leads become mechanically and electrically integral with the circuit. The process in most current use today employs a device for imparting a wave-like motion to the bath; the circuit being of sufficient height above the bath to be "wet" by the wave as it passes the length of the circuit substrate.

Regardless of the particular arrangement employed the gravitational effect on the liquid solder, clinging to the circuit leads, is such that icicles form; the solder sometimes bridging parts which were to remain electrically unconnected.

Since the soldered circuits are eventually to be mounted with predetermined spacings in a chassis, the icicling effect produces a completely random parameter whose nature cannot be predicted. Moreover the tendency today is towards miniaturization and the icicles naturally limit the proximity of adjacent circuits. Icicling and solder bridges have resulted in approximately a three percent rejection of finished products.

A number of proposals have been advanced to eliminate icicles but these have met with little success. For example, the use of various organic compounds placed on the surface of the molten solder helps to reduce the solder height, but it introduces additional and undesirable problems of fumes and the contamination of the pump in a wave soldering machine.

Another arrangement involves rectilinear vibrations imparted to the circuit substrate to shake off excess solder and reduce the surface tension while the solder is still in the molten state. However, vibrations create cold soldered joints and the displacement of leads in thin film circuitry. A cold soldered joint is an occurrence which takes place when the lead moves with respect to the circuit during the cooling off of the solder. The resultant connection appears satisfactory to the naked eye, however, internally it is intermittent if at all.

One arrangement which has proved satisfactory calls for passing the substrate over a fine stretched wire so positioned that a small space exists between the surface of the wire and the highest lead projection on the circuit substrate. The wire is disposed just beyond the wave formation in the bath such that it breaks the surface tension of the formations and substantially reduces the height of icicles and the tendency towards bridging. This arrangement is described in detail in Edgar H. Walls' U.S. patent application Ser. No. 621,701 filed Mar. 8, 1967, now U.S. Pat. No. 3,465,415 issued Sept. 9, 1969, and assigned to the same assignee. While this latter arrangement goes far towards eliminating the problem it has been found that there is still room for improvement and there exists particular applications where the inventive arrangement employed singly or in conjunction with the just described wire method is superior.

OBJECTS

It is the object of this invention to provide a new and improved method for reducing or eliminating icicle-like formations appearing on circuit substrates which are subjected to a solder bath and in particular to those formed during the wave soldering process.

It is a further object of this invention to provide a method of the foregoing type which lowers the solder profile in a simple and expeditious manner.

SUMMARY OF THE INVENTION

Briefly, the invention is predicated on the concept of inverting a previously soldered circuit containing the icicles such that it is disposed with the icicles facing vertically upward, and then subjecting the circuit to a heat treatment just sufficient to melt the solder and cause it to run, with the aid of gravity, from the peak toward the base of the icicles. Preferably, prior to heating, the circuit is subjected to a flux bath for reducing the surface tension and preventing the formation of surface oxides.

It is a feature of this invention that it may be employed in conjunction with the process described in the aforementioned patent application and is equally applicable to printed circuit boards and thin and thick film devices.

BRIEF DESCRIPTION OF THE DRAWINGS

Other objects, advantages and features of the invention will be apparent from the following detailed description of the specific embodiment thereof, when taken in conjunction with the appended drawings, in which.

DETAILED DESCRIPTION OF THE PREFERRED EMBODIMENT

Figure 1:
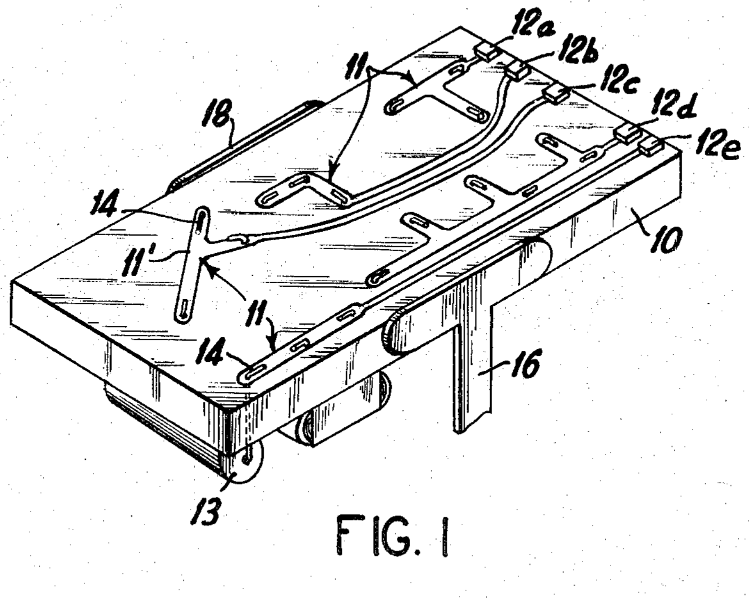
FIG. 1 is a perspective illustration of a printed circuit board, shown with the component leads passing through the insulating board and the printed circuit, prior to the soldering thereof.

Referring now to the drawings and in particular to FIG. 1, there is shown a board including a substrate 10 carrying a printed circuit 11 made up of individual circuit members 11'. The individual circuit members each include a portion leading to terminal connectors 12*a* through 12*e* for mounting the module electrically and mechanically in a larger chassis (not shown) with which it will be associated. On the other side of the substrate or board 10 there appears a plurality of components (for example, resistor 13) having their respective leads passing through substrate apertures and apertures in the contiguous printed circuit. The exposed lead length 14 is predetermined and may for example be of the order of one-eighth of an inch and bent over parallel to the substrate.

It will be appreciated by those skilled in the art that the illustrated arrangement is a conventional printed circuit board. However, it is to be emphasized that the inventive method is equally applicable to devices of thin and thick film type, without variation in the inventive process. In contradistinction to FIG. 1 for example, in the latter circuit substrate types there will be concern with only one side of the substrate and the soldering step will primarily involve lead rather than component connections.

T-shaped members 16 and 18 are provided to firmly grasp opposing edges of the circuit board for supporting it throughout the conventional process as well as the inventive process. These support members should be selected of a suitable material which does not wet with solder, such as stainless steel.

Figure 2:
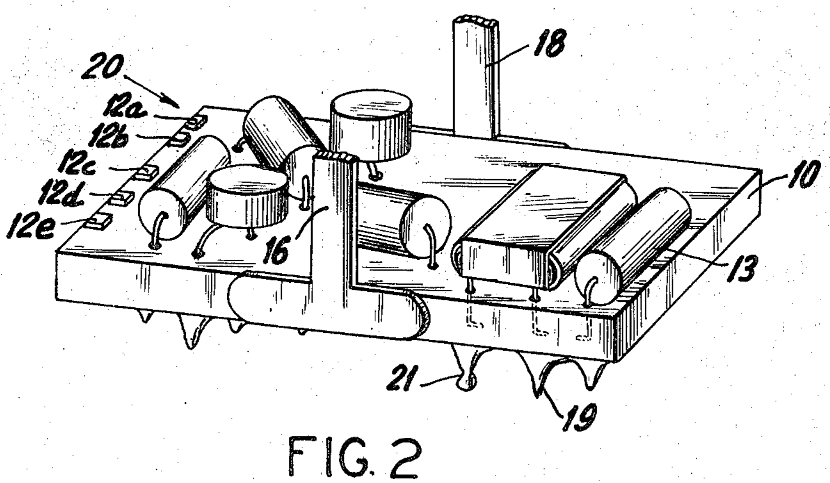
FIG. 2 is an inverted perspective illustration of the circuit board shown in FIG. 1 after being subjected to conventional soldering techniques.

The circuit board shown in FIG. 1 is now inverted and passed over a wave soldering device where it is coated with molten solder which when cooled, electrically and mechanically couples the lead wires extending from the surface and emanating from components 20 to the associated printed circuit as is well known to those skilled in the art. FIG. 2 illustrates the printed circuit board after it has been subjected to the wave soldering technique. As may be seen from this figure numerous icicles have formed some pointed (for example 19) and some bulb tipped (for example 21), but all protruding an unpredictable distance from the surface of the circuit substrate. It is these protrusions to which this invention is addressed.

Figure 3:
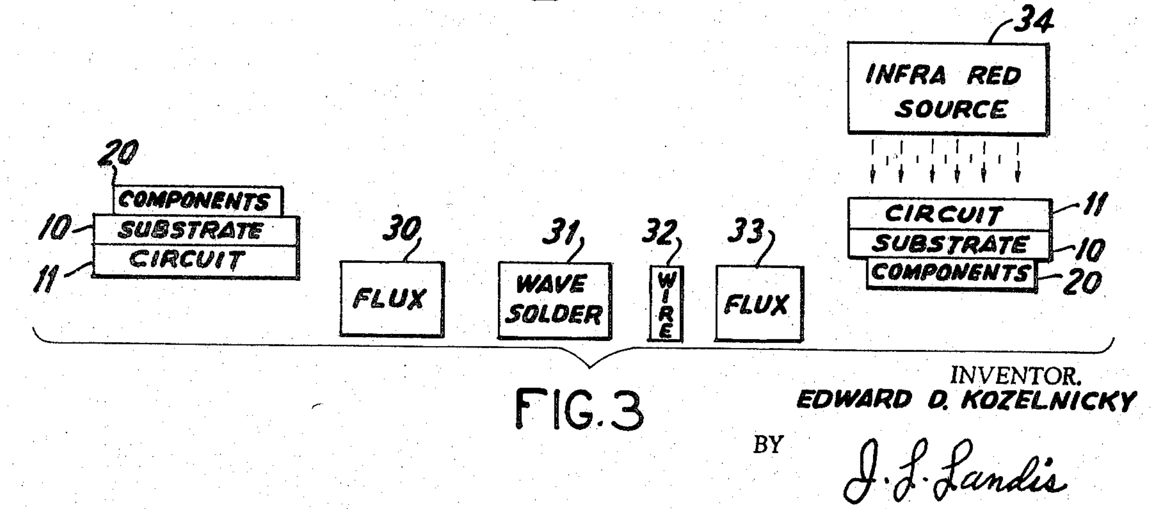
FIG. 3 is a block diagram of the inventive process.
Figure 4A:
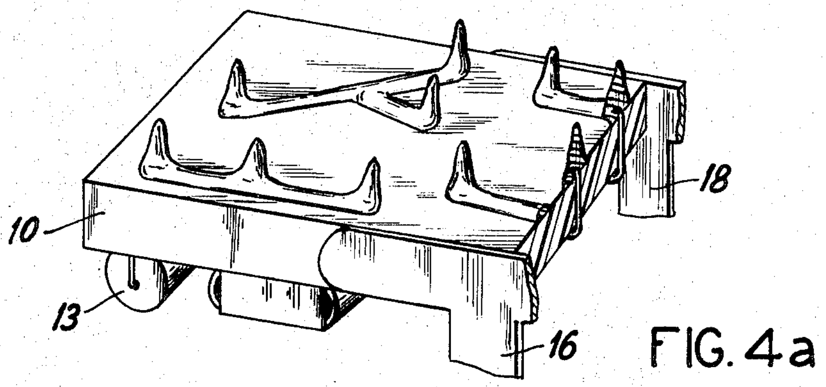
FIGS. 4*a* and 4*b* are perspective illustrations of the circuit board shown in FIG. 2 respectively before and after being subjected to the inventive process.
Figure 4B:
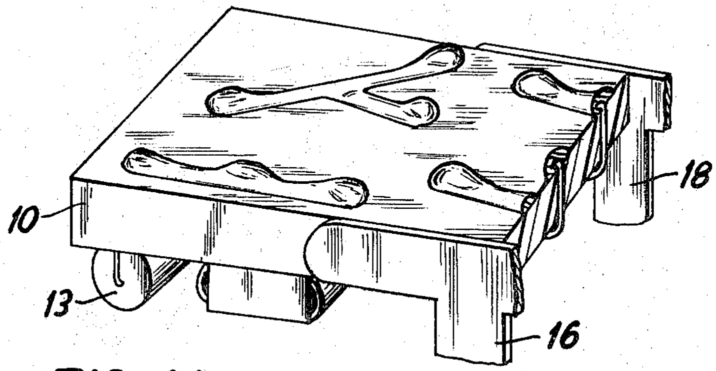

Turning now to FIGS. 3 and 4 the inventive process will now be described.

In FIG. 3 the printed circuit board is shown first with the circuit disposed below the substrate as it would appear just before entering its first flux bath 30 which acts in the known manner to clean the substrate and promote the union of the circuit 11 with the leads 14. Following the flux bath the circuit is subjected to the wave soldering 31 as previously mentioned and emerges as shown in FIG. 2.

At this point the taut wire technique 32 disclosed in the aforementioned patent application may be introduced. The wire would be oriented parallel to the solder wave and in a proximate position thereto in order to remove a substantial portion of the icicling before the solder has had the opportunity to harden. In any event once the solder has achieved a solid state the circuit is again coated with flux at station 33. This may be achieved with the circuit, carried by the substrate, in either an upwardly or downwardly facing attitude. Regardless of which attitude is assumed during the second fluxing, the printed circuit board is now positioned by means of the T-shaped carrying members 16 and 18 (in any conventional manner) with the circuit facing upwardly as shown in FIG. 3.

It is now subjected to radiant heat from source 34 for a period sufficient to bring the solder to its melting point and permit it to flow by means of gravity from the uppermost icicle portions to the base. The exact period for which the circuit is subjected to the heating depends upon the surface temperature produced by the radiating source, the melting point of the solder, and the amount of material to be removed from the peaks of the icicles. An example of these parameters will now be given with reference to FIG. 5 which illustrates a thin film type of circuit substrate.

Figure 5:
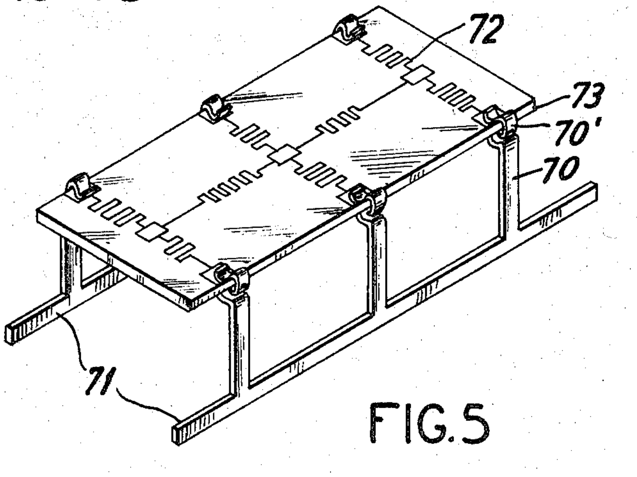
FIG. 5 is a perspective view of a thin film circuit substrate before the application of solder.
Figure 6:
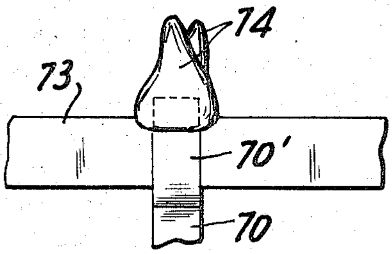
FIG. 6 is a detail of a soldered lead after the application of solder by conventional techniques to the circuit substrate of FIG. 5.

In FIG. 5 the circuit 72 is shown above the substrate 73. Mechanically locked to the circuit substrate by means of their U-shaped portions 70', are leads 70. Leads 70 are joined by a pair of connecting members 71, the two connecting members providing a manipulating means similar to the T-shaped arms 16 and 18 shown in the previous example. Upon being inverted, the thin film device of FIG. 5 is subjected to wave soldering (similar to that previously mentioned) employing a tin indium (50/50) solder. According to the invention the tin indium icicles 74 shown in FIG. 6 are now coated with flux (for example of the resin alcohol type) and passed under a quartz lamp radiating sufficient infrared energy to bring the surface temperature of the circuit substrate to 400° F. This is approximately 120° F. above the melting point of tin indium solder. The surface temperature is maintained between 380° F. and 420° F. for five to ten seconds after the last icicle melts, which in this particular embodiment has been found to be just sufficient to cause the icicles to greatly reduce in size without causing the solder to run over the circuit.

While the principles of the invention have been described in connection with specific apparatus, it is to be clearly understood that this description is made only by way of example and not as a limitation to the scope of the invention as set forth in the objects thereof and in the accompanying claims.

What is claimed is:

1. In the process for soldering conductive leads to a circuit carried upon a substrate, where the circuit is subjected to an underlying solder bath, applying molten solder and forming icicles gravitationally at the leads, the improvement for substantially reducing the height of said icicles comprising the steps following the said application of solder of:

inverting said circuit to face upwardly upon said substrate; and heating said circuit sufficiently to cause the melting and reduction in size of said icicles.

2. The improvement claimed in claim 1 further comprising the step of applying a flux to the soldered circuit prior to the heating thereof.

3. The improvement claimed in claim 1 wherein the heating is accomplished by radiation from an infra-red source disposed above said circuit.

4. In the process for soldering conductive leads to a circuit carried upon a substrate wherein the circuit is subjected to wave soldering resulting in a gravitational formation of icicles at the leads, the improvement for substantially reducing the height of said icicles comprising the steps following the application of solder of:

surface coating the soldered-covered-circuit with flux;

radiating infra-red energy downwardly upon said circuit, said circuit being oriented upwardly sufficient to cause the melting and reduction in size of said icicles.

5. The improvement claimed in claim 4 wherein said solder is tin indium and wherein the surface temperature is raised to 400° F.

(References on following page)

References Cited

UNITED STATES PATENTS

| | | | |
|---|---|---|---|
| 3,063,145 | 11/1962 | Bouton | 29—503X |
| 3,086,488 | 4/1963 | Johnson | 29—487X |
| 3,114,026 | 12/1963 | Fortune | 228—19X |
| 3,210,182 | 10/1965 | Funari | 228—19UX |
| 3,421,211 | 1/1969 | Eaves et al. | 228—38X |
| 3,359,132 | 12/1967 | Wittmann | 228—36X |
| 3,374,531 | 3/1968 | Bruce | 29—498 |
| 3,465,415 | 9/1969 | Walls | 228—22X |

OTHER REFERENCES

Welding Handbook, section 3, 5th ed., edited by Arthur L. Phillips, 1964, p. 44.22.

JOHN F. CAMPBELL, Primary Examiner

R. J. SHORE, Assistant Examiner

U.S. Cl. X.R.

29—582; 228—19